United States Patent [19]
Karner et al.

[11] Patent Number: 6,096,377
[45] Date of Patent: Aug. 1, 2000

[54] PROCESS FOR COATING SINTERED METAL CARBIDE SUBSTRATES WITH A DIAMOND FILM

[75] Inventors: Johann Karner, Feldkirch, Austria; Wolfgang Schoeb, Gams, Switzerland

[73] Assignee: Balzers Hochvakuum AG, Switzerland

[21] Appl. No.: 08/974,290

[22] Filed: Nov. 19, 1997

[30] Foreign Application Priority Data

Nov. 7, 1997 [CH] Switzerland .............................. 2580/97

[51] Int. Cl.$^7$ ............................ C23C 16/26; C23C 16/02
[52] U.S. Cl. .................................. 427/249.8; 427/249.13; 427/309; 427/560; 216/100; 51/307; 407/119
[58] Field of Search ..................................... 427/249, 309, 427/601, 560, 249.8, 249.13; 51/307; 407/119; 216/100

[56] References Cited

U.S. PATENT DOCUMENTS

| | | | |
|---|---|---|---|
| 5,425,965 | 6/1995 | Tamot et al. ............................. | 427/249 |
| 5,650,059 | 7/1997 | Shumaker et al. ....................... | 205/640 |
| 5,700,518 | 12/1997 | Lee et al. . | |

FOREIGN PATENT DOCUMENTS 500119  8/1992  European Pat. Off. .
519587  12/1992  European Pat. Off. .

OTHER PUBLICATIONS

Cappelli, E., et al., "Diamond Nucleation and Growth on Different Cutting Tool Materials: Influence of Substrate Pre–Treatment", Diamond and Related Materials, vol. 5, No. 3, Apr. 1996, pp. 292–298.

Deuerler, F., et al., "Pretreatment of Substrate surface for improved adhesion of diamond films on hard metal cutting tools", Diamond and Related Materials, vol. 5, No. 12, Dec. 1996, pp. 1478–1489.

Polini et al, J. Am. Ceram. Soc., 78(9), 1995, p. 2431–6 No month data.

Haga et al, Congr. Anu–Assoc. Bras. Metal, Mater., vol. Date 1995, 50th (vol. 4), pp. 493–497 (Portuguese) 1996 No month data.

*Primary Examiner*—Roy V. King
*Attorney, Agent, or Firm*—Notaro & Michalos P.C.

[57] ABSTRACT

A method for coating a sintered metal carbide substrate with a diamond film is disclosed, which comprises subjecting the substrate to a selective tungsten carbide etching step; subjecting the substrate to a selective Co etching step; and subsequently coating a desired section of the substrate with the diamond film, and where after completion of the selective tungsten carbide etching step and prior to diamond coating the substrate is nucleated with diamond powder through friction contact.

6 Claims, 9 Drawing Sheets

PROCESS FOR COATING SINTERED METAL CARBIDE SUBSTRATES WITH A DIAMOND FILM

FIELD AND BACKGROUND OF THE INVENTION

The present invention relates to a process for coating sintered metal carbide substrates with a diamond film.

In this context the term "sintered metal carbide" is applied to tungsten carbide sintered metal with Co bonding agent.

With respect to the need for diamond coated sintered metal carbide substrates and the development of the relevant technologies reference is made to the statements in DE-OS 19 522 372 which herewith are declared to be an integral part of the present description.

In the light of the present invention the following fundamentals of the state-of-the-art appear to be important:

From EP 0 375 923 dating from 1989 it is known that after a substrate has been machined the latter is subjected to a temperature of between 1,000° C. to 1,600° C. and subsequently the cobalt is removed from the substrate surface by means of a selective chemical etching step. Subsequently the surface is activated in an ultrasonic bath by means of hard particles, for example, diamond powder. The diamond film is subsequently deposited by means of a CVD process.

The results compiled in said patent application show a clear improvement in the wear behavior of the diamond coated substrate, however, indiscriminately for those cases in which nucleation with powder was performed or not. The differences in the results is based on the performance or non-performance of the thermal treatment.

EP 0 519 587 dating from 1991 describes the pre-existing approaches including those of said EP 0 374 923, that is, to "polish or score" the substrate surface prior to diamond coating, however, it does not describe how this "polishing or scoring" is performed. It does mention, however, that it had become known that without polishing or scoring no satisfactory adhesion of the diamond film to the sintered metal carbide substrate was achievable.

Said patent application now proposes to first subject the sintered metal carbide substrate surface to a selective tungsten carbide etching step and subsequently to a second etching step that removes the residues of the first etching step. The diamond film is subsequently deposited by a CVD or PECVD process. In defining the term "residue" etching step more precisely it is stated that the residues of the solution used in the first etching step as well as part of the cobalt bonding agent would be removed by the second etching step.

In any case it is emphasized that the treated substrates are not polished.

DE-OS 19 522 372 dating from 1995 finally proposes, to indiscriminately subjected polished or scored sintered metal carbide substrates first to a selective Co etching step in a first chemical system, after cleaning to a second selective tungsten carbide etching step in a second chemical system, and to finally deposit the diamond film after a second cleaning step. It is claimed that the desired removal of surface grains from the tungsten carbide could be achieved through said multi-step etching process and that the only difference in whether the substrates were previously polished or scored was that in one case the tungsten carbide grains were damaged whereas in the other they were not.

Based on the latter technique in which the sintered metal carbide substrates are subjected to a selective tungsten carbide etching step and a diamond film is subsequently deposited on the desired portion of the substrate, the task of the present invention is to create a process that further improves the adhesion of the diamond film on the sintered metal carbide substrate. This is achieved by nucleating the substrate with diamond powder after the selective tungsten carbide etching step and before the diamond film is deposited.

In contrast to EP 0 374 923 it is recognized that nucleation of the substrate surfaces with diamond powder results in significantly higher adhesive strength of the diamond film only after the selective tungsten carbide etching step. In contrast to DE-OS 19 522 372 as well as EP 0 519 587, diamond powder nucleation of the substrate surfaces result in significantly higher adhesive strength but only if this nucleation is performed after the selective tungsten carbide etching step, rather than before.

SUMMARY OF THE INVENTION

In a preferred design of the process according to the invention it is proposed to use a selective Co etching step in addition to the selective tungsten carbide etching step, in particular if there is such a high Co concentration on the substrate (see design example in DE 19 522 372) that the adhesive strength of the diamond film is impaired.

As mentioned it is essential within the framework of the present invention to perform the diamond powder nucleation, of course, before the diamond coating, but in addition also after the selective tungsten carbide etching. Therefore the process according to the invention, preferably with selective Co etching, can be realized as follows:

Co etching
Tungsten carbide etching
Diamond powder nucleation
Diamond coating
or
Tungsten carbide etching
Diamond powder nucleation
Co etching
Diamond coating
or
Tungsten carbide etching
Co etching
Diamond powder nucleation
Diamond coating With respect to the known chemical systems that are suited to selective tungsten carbide etching as well as selective Co etching, reference is again made to DE 19 522 372 which also in this respect is declared to be an integral part of the present description.

As mentioned in that document said etchings steps are basically performed in liquid chemical systems. Nucleation with diamond powder can be performed in a dry system, for example, through bombardment or friction with diamond powder, but following the nucleation step described in EP 0 374 923 it is preferably performed in an ultrasonic bath, however, concurrently with the etching step, that is, through ultrasonic impingement of the corresponding liquid chemical etching system and by putting the diamond powder into the etching bath.

DESCRIPTION OF THE PREFERRED EMBODIMENTS

In the following we shall define based on examples the treated sintered metal carbide substrates, their treatment according to the invention and for comparison the treatment not according to the invention, as well as the subsequently performed wear performance tests, after which the results are presented and discussed based on diagrams.

A) Sintered metal carbide substrates on which the investigations are based

Type 3%: Hard metal alloy reversible tips Sandvik H05
  Geometry: SPGN 120308
Type 6%: Hard metal alloy reversible tips Sandvik M134
  Geometry: SPGN 120308

B) Treatment

B.1) All aforementioned substrates have been treated in the following sequence:

Tungsten carbide etching step;
Co etching step;
Nucleation step;

For those reversible tips that were not nucleated for comparative investigations only the nucleation step was omitted.

B.2) Diamond coating

The reversible tips which according to the invention were diamond powder nucleated, and the reversible tips not conforming to the invention that were subjected to the same treatment but not nucleated with diamond powder, were tested as follows:

Face milling
Milled material: AlSi20
Feed rate: 0.1 mm/revolution
Cutting depth per revolution: 1 tooth
Cutting depth: 0.5 mm C) Results The flank wear as a function of the milling time in minutes was measured and plotted, that is, the greatest extent of the sinter metal carbide surfaces exposed through gradual diamond film wear. Spalling of the diamond film resulted in a sudden and rapid increase in flank wear.

DESCRIPTION OF THE PREFERRED EMBODIMENT

Figure 1:
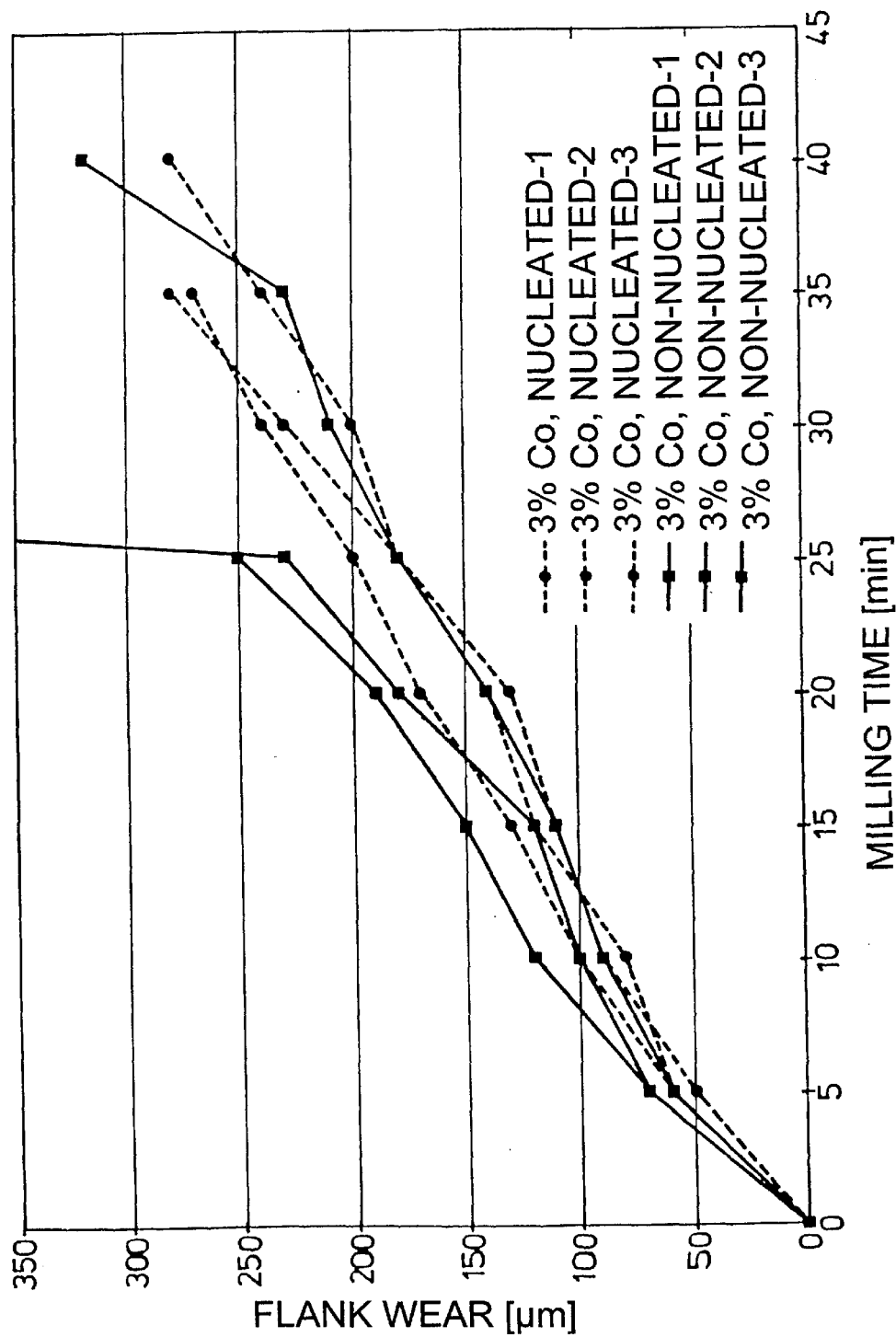
FIG. 1 is a graph plotting wear against time.

The dashed lines in FIG. 1 show the progression of the "Flank wear as a function of the milling time" type 3% reversible tips that have been diamond powder nucleated according to the invention, as well as for the type 3% reversible tips not according to the invention, all coated with a diamond film thickness of 20 $\mu$m.

It is evident that under the specified milling conditions the frequency of film spalling of non-nucleated type 3% reversible tips is higher than for nucleated ones.

Figure 2:
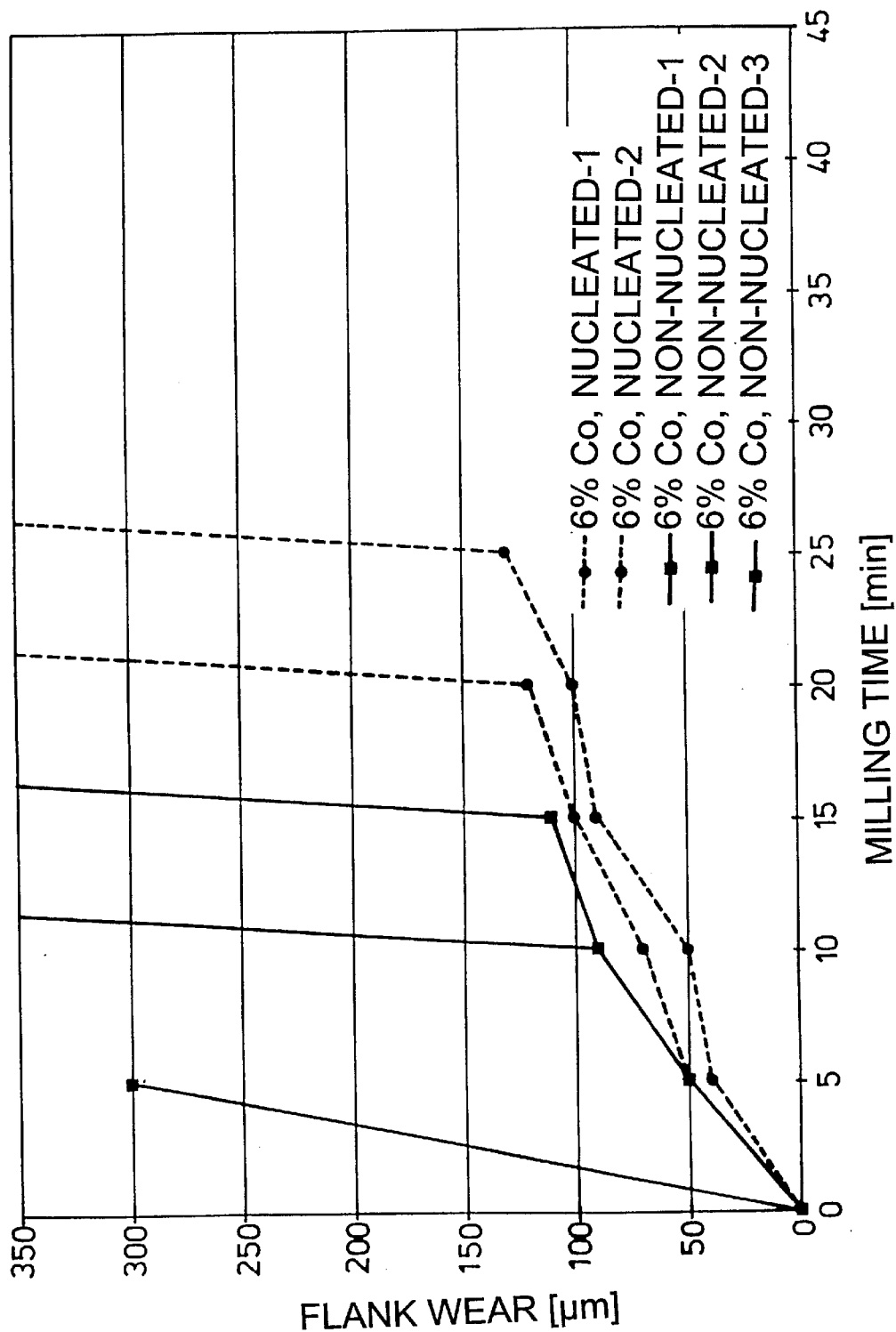
FIG. 2 is a graph similar to that of FIG. 1.

FIG. 2 shows the results analogously to the ones compiled in FIG. 1, for two type 6% reversible tips (shown with dashed lines) that were nucleated according to the invention as well as for three type 6% reversible tips that were not nucleated with diamond powder according to the invention. The cutting speed was again 1,200 m/min; the diamond film thickness is 20 $\mu$m (micrometer).

This diagram clearly shows that the nucleated substrates achieve longer tool lives before spalling occurs.

Figure 3:
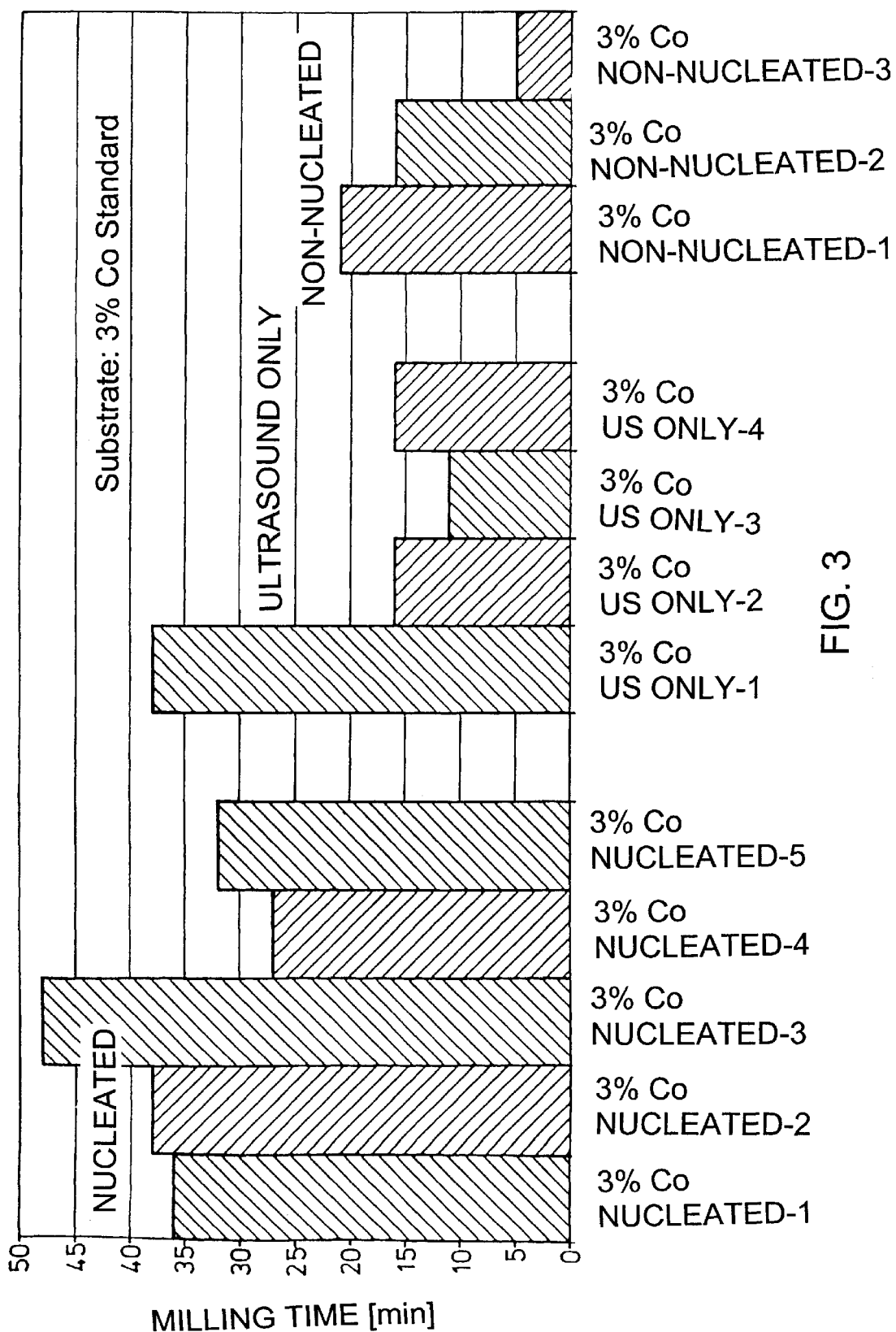
FIG. 3 is a bar chart showing milling time for different materials.
Figure 4A:
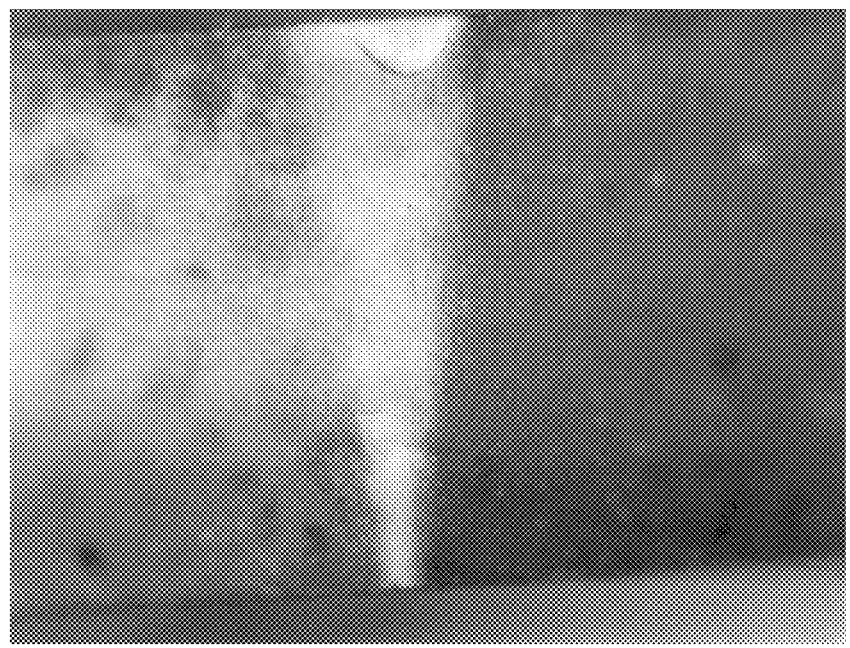
FIGS. 4a, 4b, 4c, 4d, 4e and 4f are micrographs showing milling tips of the present invention.
Figure 4B:
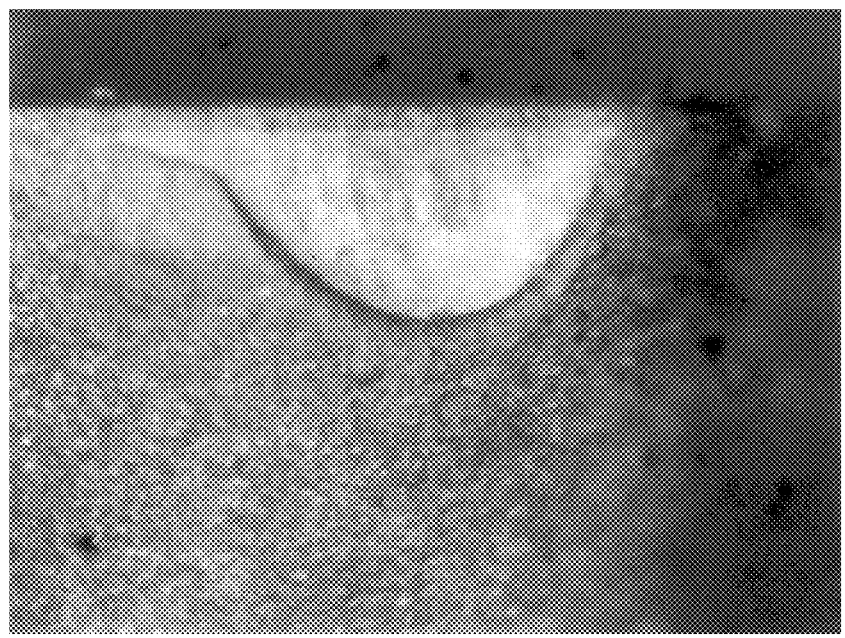
Figure 4C:
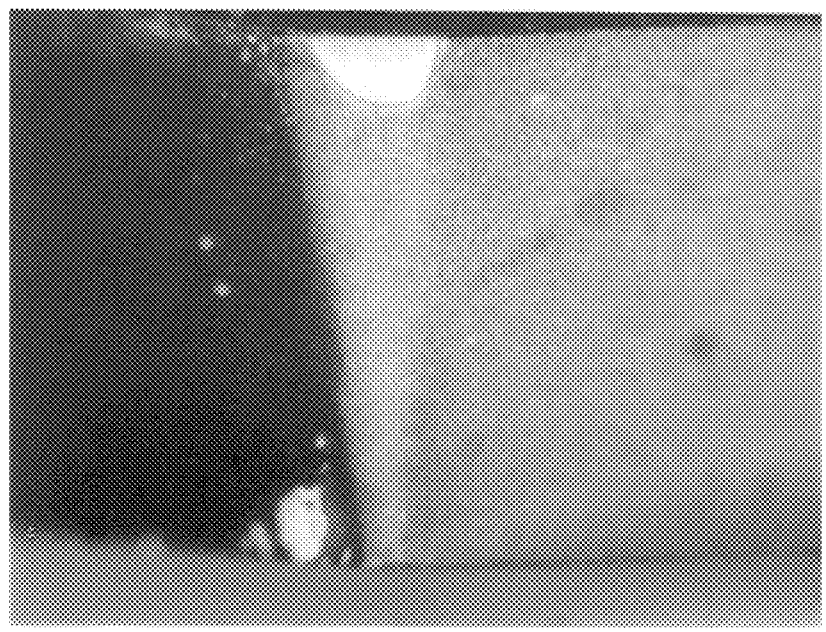
Figure 4D:
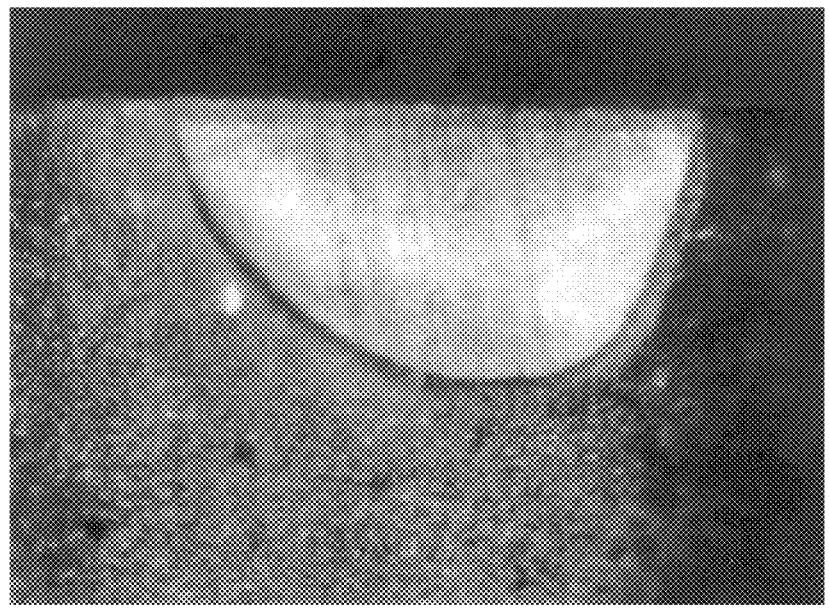
Figure 4E:
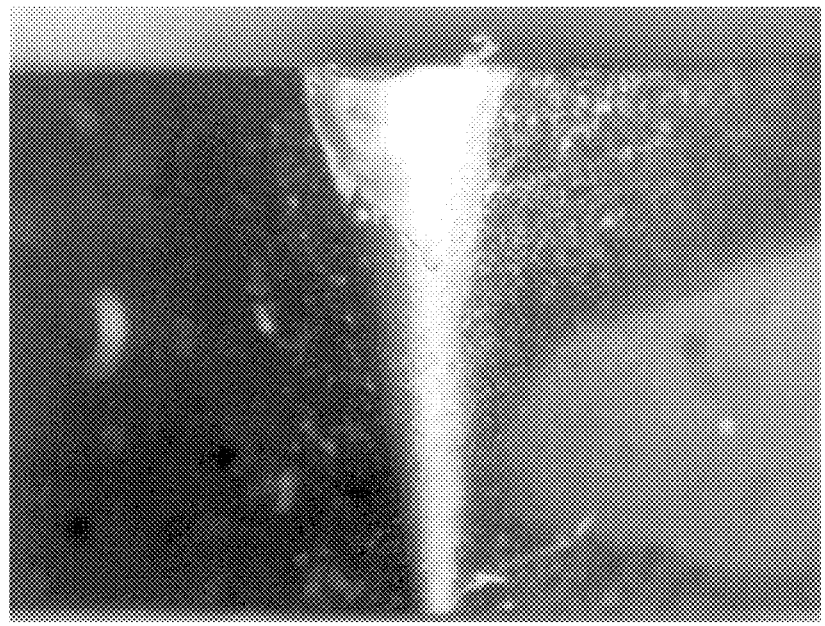
Figure 4F:
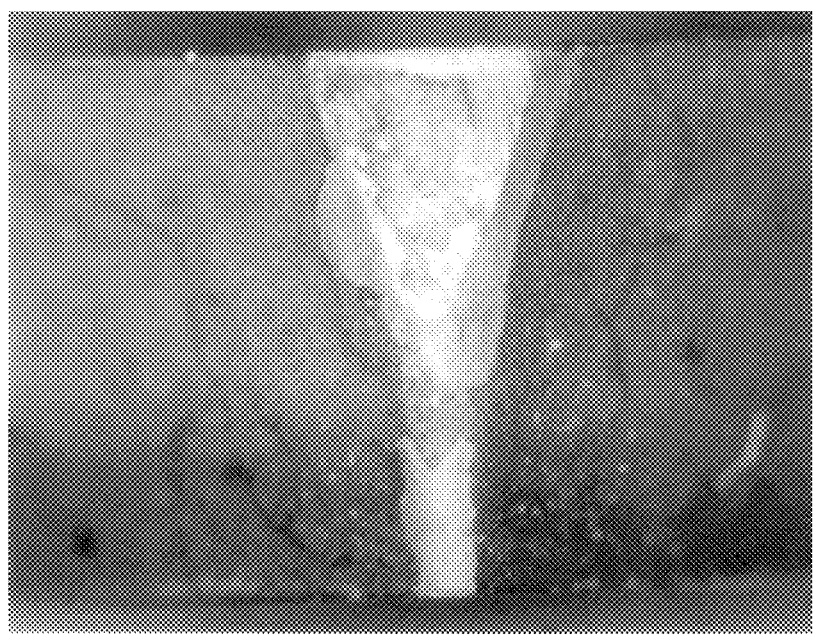

FIG. 3 shows the milling time up to the occurrence of spalling for nucleated 3% reversible tips as well as for 3% reversible tips that were tungsten carbide and cobalt etched as mentioned above but only cleaned with ultrasound rather than nucleated, and further for non-nucleated type 3% reversible tips that have not been cleaned with ultrasound. The cutting speed was 1,500 m/min, the thickness of the diamond film was again 20 $\mu$m. The improved film adhesion on the substrates treated according to the invention is clearly evident. Whereas the nucleated substrates according to the invention exhibit a largely linear wear behavior up to large exposed areas of the sintered metal carbide surface, early film spalling occurred particularly on the substrates that were neither nucleated nor cleaned with ultrasound. This is confirmed by the light microscopic examinations according to FIGS. 4a to 4b on the reversible tips nucleated according to the invention with a magnification factor of 20 (FIGS. 4a, 4c, 4e) and 80 (FIGS. 4b, 4d, 4f) which show a perfect ground section of the film whereas the non-nucleated reversible tips according to FIGS. 4e and 4f show clearly that the diamond film has spalled off the base material.

Figure 5:
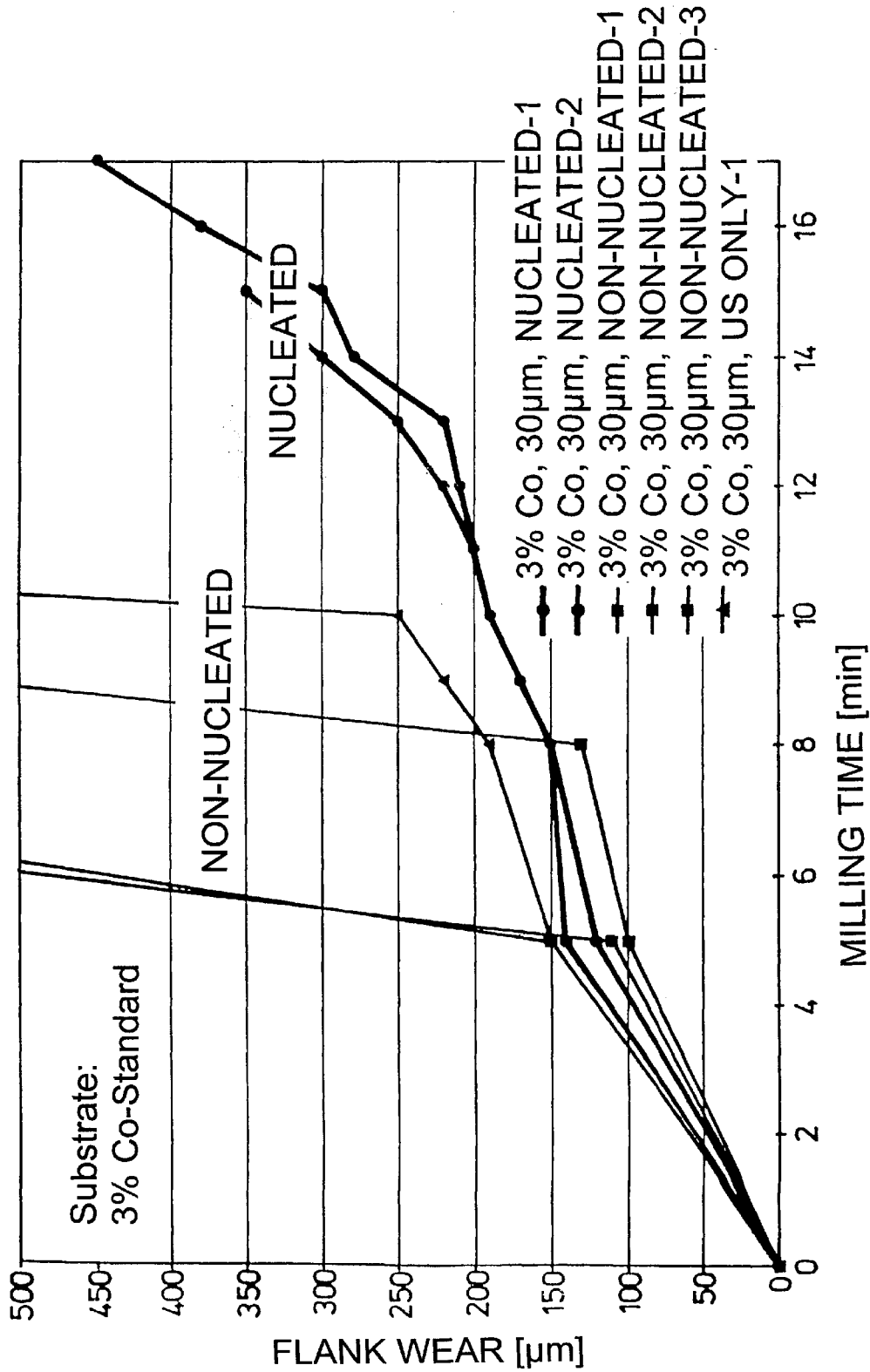
FIG. 5 is a graph similar to FIG. 1.

Additionally, commercially available, diamond coated reversible tips Sandvik M05 were tested for comparison purposes, as shown in FIG. 5, and compared with those that were coated according to the invention. The cutting speed was 2,000 m/min.

The three reversible tips that were not nucleated exhibited film spalling at an early stage. The same applies to a lesser degree also to the above defined, etch treated, nonnucleated but ultrasonically cleaned reversible tips as shown in curve —Δ—. Clearly evident is, however, the significant improvement of the wear behavior on the reversible tips nucleated according to the invention as shown by the curve drawn in a heavy line.

Figure 6:
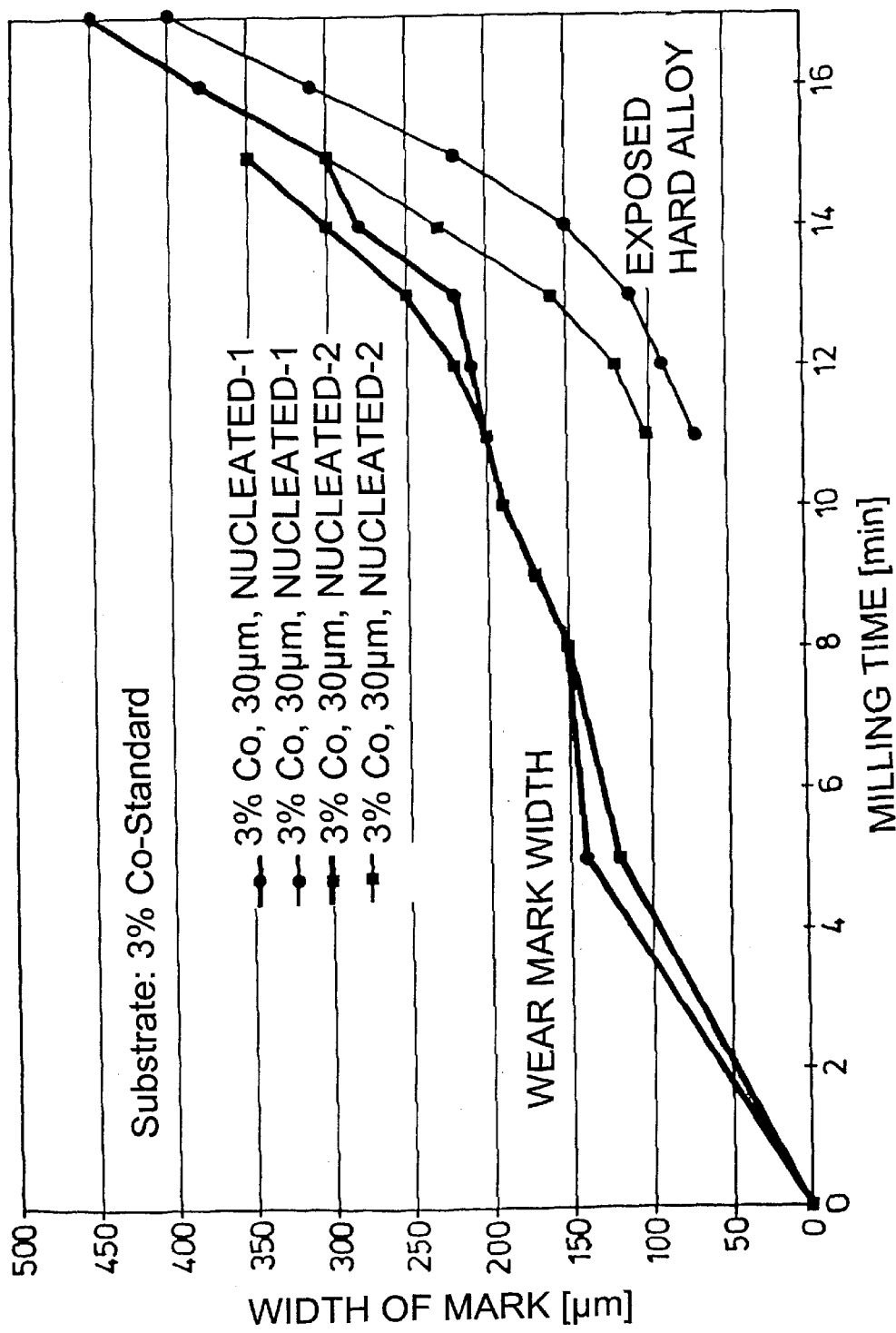
FIG. 6 is a graph plotting mark width against time.

FIG. 6 shows the wear mark width as well as the magnitude of the exposed sintered metal carbide material as a function of the milling time, with a cutting speed of 2,000 m/min and a diamond film thickness of 30 $\mu$m according to FIG. 5, on reversible tips that have been diamond powder nucleated according to the invention.

Figure 7:
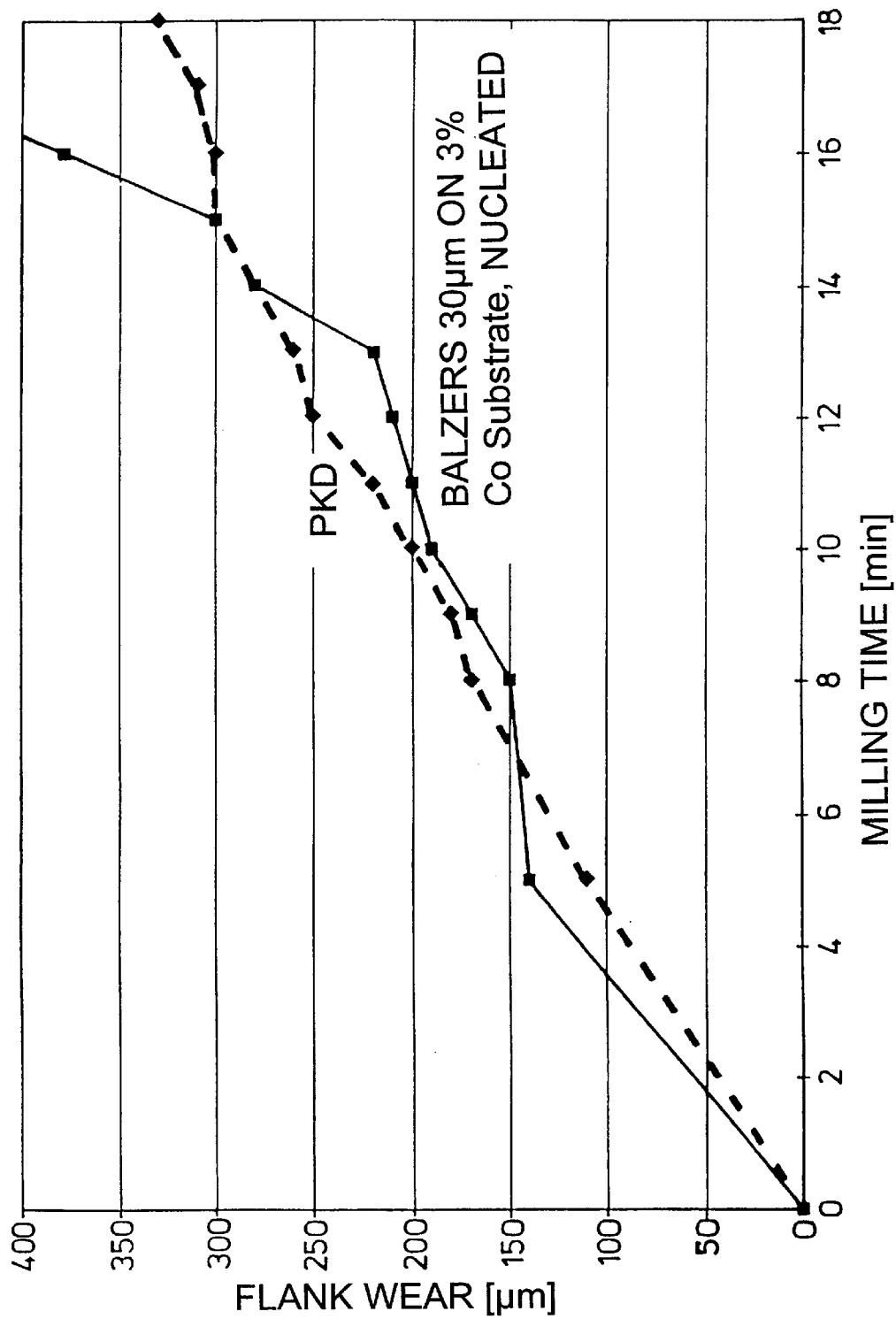
FIG. 7 is another graph similar to FIG. 1.

FIG. 7 shows the flank wear as a function of the milling time on a type 3% reversible tip, treated according to the invention and coated with a diamond film of 27 $\mu$m, in comparison with a commercially available polycrystalline diamond (PKD) coated tip. As can be seen the reversible tips according to the invention achieve a similar wear behavior as PKD tips.

These results demonstrate that in comparison with tips that were not nucleated but otherwise treated basically in the same manner, that is, in particular as specified in DE 19 522 372 and EP 0 519 587, the wear behavior of reversible tips coated according to the invention is significantly better, depending on the test conditions (cutting speed) and as known, on the Co content of the substrate material.

As already mentioned the chemical etching systems for selective tungsten carbide etching or selective Co etching, are already known e.g. from the aforementioned patent applications and the systems used in the present examples may readily be replaced with other aforementioned previously known systems. With respect to diamond coating many processes are known. The present invention is limited neither to the performance of said etching steps with specific chemical systems nor the utilization of a special diamond coating technique.

The process according to the invention is particularly suited to the manufacture of tools, in particularly metal cutting tools such as milling cutters, drills, reversible tips or machine components such as bearing shells and shafts.

What is claimed is:

1. Process for coating a sintered metal carbide substrate with a diamond film comprising:
    subjecting the substrate to a selective tungsten carbide etching step,
    subjecting the substrate to a selective Co etching step,
    subsequently coating on a desired section of the substrate, the diamond film, and
    where after completion of the selective tungsten carbide etching step and prior to diamond coating the substrate is nucleated with diamond powder through friction contact.

2. Process according to claim 1 where one of the following step sequences is followed:
    (a)
        Selective Co etching,
        Selective tungsten carbide etching,
        Diamond powder nucleation,
        Diamond coating;
    (b)
        Selective tungsten carbide etching,
        Selective Co etching,
        Diamond powder nucleation,
        Diamond coating;
    (c)
        Selective tungsten carbide etching
        Diamond powder nucleation
        Selective Co etching
        Diamond coating.

3. Process according to claim 1 in which diamond powder nucleation takes place in an ultrasonic bath.

4. Process according to claim 3 in which a liquid medium of the ultrasonic bath is also a chemical system for one of said selective etching steps.

5. The process according to claim 1 is used to manufacture tools which are selected from the group consisting of milling cutters, drills and reversible tips.

6. The process according to claim 1 is used to manufacture tools which are selected from the group consisting of bearing shells and shafts.

* * * * *